(12) United States Patent
Nakae et al.

(10) Patent No.: US 11,236,738 B2
(45) Date of Patent: Feb. 1, 2022

(54) COOLING APPARATUS

(71) Applicant: Nidec Corporation, Kyoto (JP)

(72) Inventors: Nobuya Nakae, Kyoto (JP); Akihiko Makita, Kyoto (JP); Hidenobu Takeshita, Kyoto (JP); Tomotsugu Sugiyama, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 16 days.

(21) Appl. No.: 16/297,769

(22) Filed: Mar. 11, 2019

(65) Prior Publication Data

US 2019/0307020 A1 Oct. 3, 2019

(30) Foreign Application Priority Data

Mar. 30, 2018 (JP) .............................. JP2018-067944

(51) Int. Cl.
*H05K 7/20* (2006.01)
*F28F 3/02* (2006.01)
*F28F 3/12* (2006.01)
*F04B 17/03* (2006.01)
*F04B 19/04* (2006.01)
*F04B 43/04* (2006.01)

(52) U.S. Cl.
CPC .............. *F04B 17/03* (2013.01); *F04B 19/04* (2013.01); *F28F 3/02* (2013.01); *F28F 3/12* (2013.01); *H05K 7/20254* (2013.01); *H05K 7/20263* (2013.01); *H05K 7/20272* (2013.01); *F04B 43/04* (2013.01)

(58) Field of Classification Search
CPC ....... H01L 23/40; H01L 23/46; H01L 23/473; H01L 23/3672; H01L 23/467; H01L 23/4735; H05K 7/20; H05K 7/20272; H05K 7/20263; H05K 7/20254; H05K 7/20409; H05K 7/202509; F28D 1/05375; F28D 1/05383; F28D 1/05366; F28D 2021/0031; F28D 2021/0029; F28F 2250/08; F28F 1/02; F28F 1/022; F28F 3/02; F28F 3/12
See application file for complete search history.

(56) References Cited

U.S. PATENT DOCUMENTS

| 6,749,012 B2 | 6/2004 | Gwin et al. |
| 7,325,591 B2 | 2/2008 | Duan et al. |
| 7,407,000 B2 * | 8/2008 | Lee .......................... G06F 1/20 165/104.33 |

(Continued)

FOREIGN PATENT DOCUMENTS

JP 2004-304076 A 10/2004

OTHER PUBLICATIONS

Nakae et al., "Cooling Apparatus", U.S. Appl. No. 16/297,770, filed Mar. 11, 2019.

*Primary Examiner* — Len Tran
*Assistant Examiner* — Jennam Hopkins
(74) *Attorney, Agent, or Firm* — Keating & Bennett

(57) ABSTRACT

A cooling apparatus includes a cold plate including a lower surface to be in contact with a heat-radiating component, and a first coolant passage in which a coolant flows, a radiator including fins to perform cooling, and a second coolant passage in which the coolant flows, and a pump connected to each of the first coolant passage and the second coolant passage to circulate the coolant. The radiator is provided on the cold plate. The pump is adjacent to the radiator.

12 Claims, 9 Drawing Sheets

(56) References Cited

U.S. PATENT DOCUMENTS

| | | | |
|---|---|---|---|
| 9,848,515 B1* | 12/2017 | Janak | G06F 1/20 |
| 10,048,008 B1* | 8/2018 | Mounioloux | F28D 1/05391 |
| 2004/0190250 A1 | 9/2004 | Iijima et al. | |
| 2006/0185378 A1 | 8/2006 | Duan et al. | |
| 2007/0023167 A1* | 2/2007 | Liu | H01L 23/473 |
| | | | 165/80.4 |
| 2007/0034353 A1* | 2/2007 | Liu | H01L 23/473 |
| | | | 165/80.4 |
| 2007/0034359 A1* | 2/2007 | Liu | F28D 1/05366 |
| | | | 165/104.31 |
| 2007/0103869 A1* | 5/2007 | Liu | H01L 23/473 |
| | | | 361/699 |
| 2007/0110559 A1* | 5/2007 | Liu | F04D 13/0673 |
| | | | 415/90 |
| 2008/0128114 A1* | 6/2008 | Lai | H01L 23/473 |
| | | | 165/80.4 |
| 2008/0169086 A1* | 7/2008 | Hu | H01L 23/473 |
| | | | 165/80.4 |
| 2008/0179041 A1* | 7/2008 | Hu | H01L 23/473 |
| | | | 165/71 |
| 2008/0179044 A1* | 7/2008 | Hu | H01L 23/473 |
| | | | 165/80.4 |
| 2009/0044929 A1* | 2/2009 | Yeh | H01L 23/473 |
| | | | 165/104.19 |
| 2009/0090489 A1* | 4/2009 | Chiang | H05K 7/20254 |
| | | | 165/104.33 |
| 2011/0272120 A1* | 11/2011 | Joshi | F28D 1/05366 |
| | | | 165/104.13 |
| 2013/0299139 A1* | 11/2013 | Mounioloux | G06F 1/20 |
| | | | 165/120 |
| 2016/0136851 A1* | 5/2016 | Campbell | H05K 7/20436 |
| | | | 264/279 |
| 2016/0234968 A1* | 8/2016 | Huang | G06F 1/20 |
| 2016/0242320 A1* | 8/2016 | Agostini | F28D 15/0266 |
| 2016/0330868 A1* | 11/2016 | Sun | H05K 7/20336 |
| 2016/0341488 A1* | 11/2016 | Wan | H01L 23/427 |
| 2016/0366788 A1* | 12/2016 | Liao | H05K 7/20272 |
| 2017/0014929 A1* | 1/2017 | So | B23K 35/025 |
| 2017/0023317 A1* | 1/2017 | Zhang | F28F 3/12 |
| 2017/0045306 A1* | 2/2017 | Tsai | H01L 23/473 |
| 2017/0045307 A1* | 2/2017 | Tsai | H01L 23/467 |
| 2017/0055370 A1* | 2/2017 | Tsai | H05K 7/20272 |
| 2017/0105312 A1* | 4/2017 | Tsai | G06F 1/20 |
| 2017/0115708 A1* | 4/2017 | Tivadar | G06F 1/20 |
| 2017/0212560 A1* | 7/2017 | Tsai | H05K 7/20272 |
| 2017/0367216 A1* | 12/2017 | Shen | H05K 7/20272 |
| 2017/0367217 A1* | 12/2017 | Xiao | H01L 23/473 |
| 2018/0023594 A1* | 1/2018 | Sheng | F04D 1/06 |
| | | | 165/104.31 |
| 2018/0063993 A1* | 3/2018 | Wu | H05K 7/20272 |
| 2018/0092247 A1* | 3/2018 | Chiu | F28F 9/0221 |
| 2018/0092249 A1* | 3/2018 | Chiu | F28F 1/28 |
| 2018/0132386 A1* | 5/2018 | Tung | F28F 1/126 |
| 2018/0172355 A1* | 6/2018 | Takase | F28F 9/26 |
| 2018/0195804 A1* | 7/2018 | Mai | F28F 23/02 |
| 2018/0228040 A1* | 8/2018 | Lykke | F28F 13/12 |
| 2018/0269131 A1* | 9/2018 | Na | H05K 7/20263 |
| 2018/0308786 A1* | 10/2018 | Huang | F28D 1/0535 |
| 2018/0340736 A1* | 11/2018 | Mounioloux | F28D 1/05341 |
| 2019/0041144 A1* | 2/2019 | Wan | H05K 7/20309 |
| 2019/0053403 A1* | 2/2019 | Lin | H05K 7/20327 |
| 2019/0056179 A1* | 2/2019 | Chialastri | F28D 15/0208 |
| 2019/0069444 A1* | 2/2019 | Wan | H05K 7/20309 |
| 2019/0090384 A1* | 3/2019 | Xiao | H05K 7/20272 |
| 2019/0128623 A1* | 5/2019 | Maeyama | F28D 1/05383 |
| 2019/0166720 A1* | 5/2019 | Takemura | H05K 7/20254 |
| 2019/0174653 A1* | 6/2019 | Fan | H05K 7/20272 |
| 2019/0239388 A1* | 8/2019 | Tsai | H05K 7/20254 |
| 2020/0084913 A1* | 3/2020 | Jia | F28F 3/022 |

* cited by examiner

COOLING APPARATUS

CROSS REFERENCE TO RELATED APPLICATIONS

This application claims the benefit of priority to Japanese Patent Application No. 2018-067944 filed on Mar. 30, 2018. The entire content of this application are hereby incorporated herein by reference.

BACKGROUND OF THE INVENTION

1. Field of the Invention

The present disclosure relates to a cooling apparatus.

2. Description of the Related Art

A known cooling apparatus typically includes a heat sink, a radiator, and an electric pump. The heat sink typically includes an electronic component-mounting surface on which an electronic component to be cooled is mounted, and a coolant passage in which a liquid flows as a coolant. The radiator typically includes a liquid passage in which a coolant flows, and the liquid passage is typically air-cooled to cool the coolant. The electric pump is typically arranged to give energy for transfer to the coolant to cause the coolant to circulate between the heat sink and the radiator.

However, in such a known cooling apparatus, the heat sink, the radiator, and the electric pump are typically connected to one another through a pipe, and this may result in an excessive size of the cooling apparatus as a whole.

SUMMARY OF THE INVENTION

A cooling apparatus according to an example embodiment of the present disclosure includes a cold plate, a radiator, and a pump. The cold plate includes a lower surface to be in contact with a heat-radiating component, and a first coolant passage in which a coolant flows. The radiator includes fins used to perform cooling, and a second coolant passage in which the coolant flows. The pump is connected to each of the first coolant passage and the second coolant passage to circulate the coolant. The radiator is provided on the cold plate, and the pump is adjacent to the radiator.

The above and other elements, features, steps, characteristics and advantages of the present disclosure will become more apparent from the following detailed description of the example embodiments with reference to the attached drawings.

DETAILED DESCRIPTION OF THE PREFERRED EMBODIMENTS

Hereinafter, example embodiments of the present disclosure will be described with reference to the accompanying drawings. It is assumed herein that a side of a cold plate 10 on which a radiator 20 is arranged is referred to as an upper side, while an opposite side of the cold plate 10 with respect to the radiator 20 is referred to as a lower side. It is also assumed herein that the radiator 20 and the cold plate 10 are arranged one above the other in a vertical direction, and that a direction perpendicular to the vertical direction is referred to as a horizontal direction. The shape of each member or portion and relative positions of different members or portions will be described based on the above assumptions. Note, however, that the above definitions of the vertical direction, the upper and lower sides, and the horizontal direction are simply made for the sake of convenience in description, and should not be construed to restrict the orientation of a cooling apparatus 1 according to any preferred embodiment of the present disclosure at the time of manufacture or when in use.

Also note that the term "parallel" as used herein includes both "parallel" and "substantially parallel". Also note that the term "perpendicular" as used herein includes both "perpendicular" and "substantially perpendicular".

Figure 1:
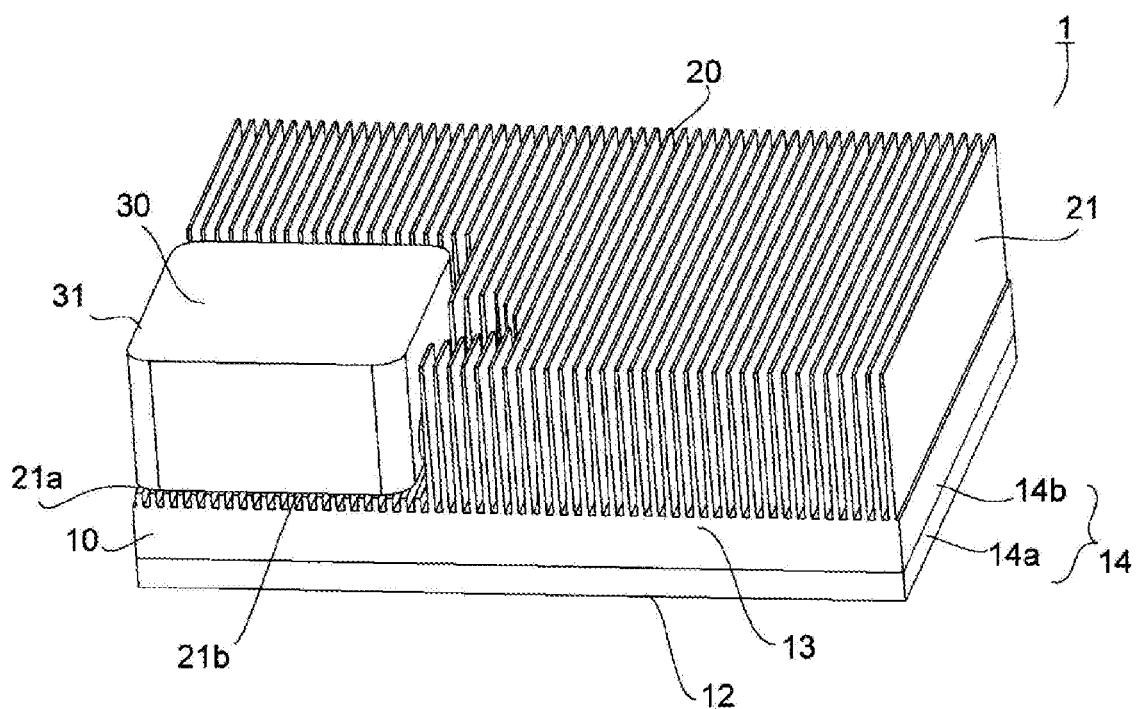
FIG. 1 is a perspective view of a cooling apparatus according to a first example embodiment of the present disclosure.
Figure 2:
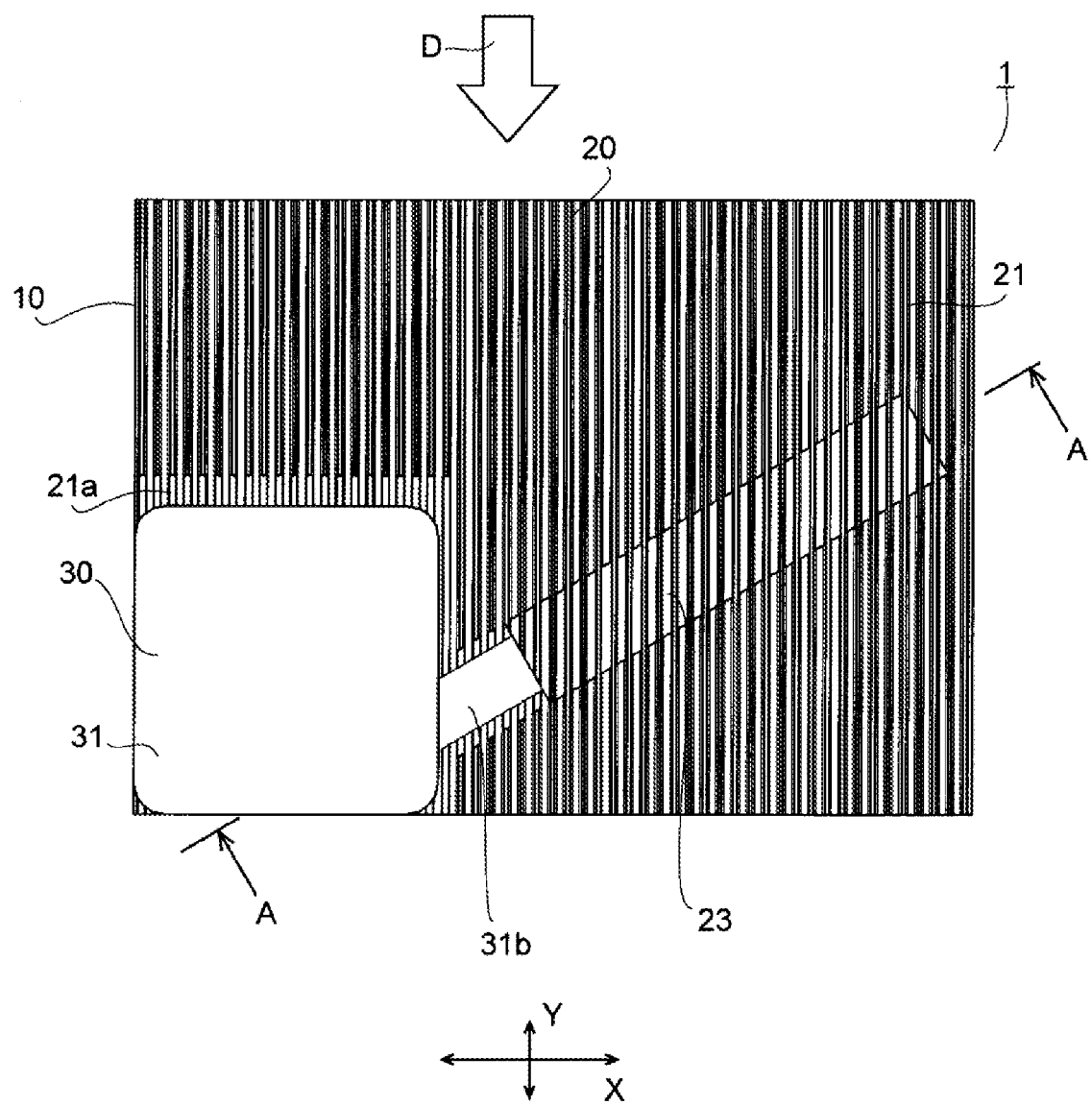
FIG. 2 is a top view of the cooling apparatus according to the first example embodiment of the present disclosure.
Figure 3:
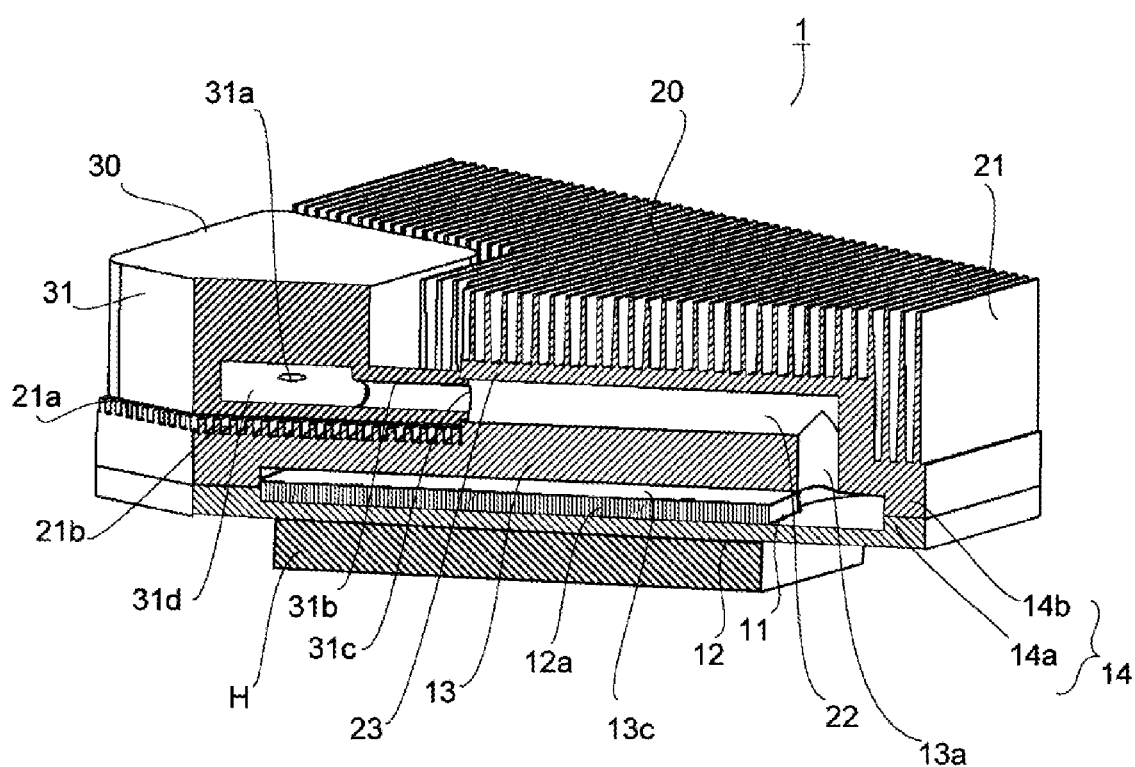
FIG. 3 is a perspective sectional view of the cooling apparatus taken along line A-A in FIG. 2.

A cooling apparatus according to a preferred embodiment of the present disclosure will now be described below. FIGS. 1 and 2 are a perspective view and a top view, respectively, of a cooling apparatus 1 according to a preferred embodiment of the present disclosure. FIG. 3 is a perspective sectional view of the cooling apparatus 1 taken along line A-A in FIG. 2.

The cooling apparatus 1 includes a cold plate 10, a radiator 20, and a pump 30. The radiator 20 and the pump 30 are arranged on the cold plate 10. A lower surface of the radiator 20 is arranged to be in contact with an upper surface of the cold plate 10. The pump 30 is arranged adjacent to the radiator 20.

The cold plate 10 is made of a metal having a high thermal conductivity, such as, for example, copper or aluminum, and includes a bottom wall portion 12, an upper wall portion 13, and a side wall portion 14. In the present preferred embodiment, the cold plate 10 is rectangular in a plan view. That is, each of the bottom wall portion 12 and the upper wall portion 13 is in the shape of a plate extending horizontally and being rectangular in a plan view. Note that, although each of the bottom wall portion 12 and the upper wall portion 13 according to the present preferred embodiment is in the shape of a quadrilateral in a plan view, each of the bottom wall portion 12 and the upper wall portion 13 may alternatively be in the shape of, for example, another polygon having a plurality of angles or a circle in a plan view.

A heat-radiating component H is arranged to be in contact with a lower surface of the bottom wall portion 12.

The side wall portion 14 is arranged to join outer edges of the bottom wall portion 12 and the upper wall portion 13. The side wall portion 14 includes a first side wall portion 14a arranged to extend upward from the outer edge of the bottom wall portion 12, and a second side wall portion 14b arranged to extend downward from the outer edge of the upper wall portion 13. An upper surface of the first side wall portion 14a and a lower surface of the second side wall portion 14b are joined to each other.

Referring to FIG. 3, a first coolant passage 11 in the shape of a rectangular parallelepiped is defined in an interior space enclosed by the bottom wall portion 12, the upper wall portion 13, and the side wall portion 14. In addition, the upper wall portion 13 includes an inflow port 13a and an outflow port 13b, which will be described below, each of which is arranged to pass through a portion of the upper wall portion 13 in the vertical direction. A coolant flows into the first coolant passage 11 through the inflow port 13a, and flows out of the first coolant passage 11 through the outflow port 13b. That is, the cold plate 10 includes the plate-shaped bottom wall portion 12, the upper wall portion 13, which is arranged to cover an upper surface of the bottom wall portion 12, and the side wall portion 14, which is arranged to join the outer edges of the bottom wall portion 12 and the upper wall portion 13, and the first coolant passage 11 is defined in the interior space enclosed by the bottom wall portion 12, the upper wall portion 13, and the side wall portion 14. The inflow port 13a is arranged at or near an end portion of the first coolant passage 11 on one side, while the outflow port 13b is arranged at or near an end portion of the first coolant passage 11 on an opposite side. In the present preferred embodiment, the coolant is a liquid, and examples of the coolant that can be used include pure water and an antifreeze solution, such as, for example, an aqueous solution of ethylene glycol or an aqueous solution of propylene glycol.

The radiator 20 includes a plurality of fins 21 used for cooling, and a second coolant passage 22. Each fin 21 is in the shape of a flat plate, and is arranged to extend upward from an upper surface of the upper wall portion 13 and in a horizontal direction on the cold plate 10. In the present preferred embodiment, the cold plate 10 has a longitudinal direction X and a widthwise direction Y, and each of the fins 21 is arranged to extend in the widthwise direction Y.

A lower end of each fin 21 is arranged to be in contact with the upper surface of the upper wall portion 13. This arrangement promotes heat transfer from the upper wall portion 13 to the fin 21. Note that the fins 21 and the upper wall portion 13 may be defined either by separate members or by a single monolithic member. In the present preferred embodiment, the fins 21 and the upper wall portion 13 are defined by separate members. The lower end of each fin 21 is joined to the upper surface of the upper wall portion 13 through welding, for example.

In the case where the fins 21 and the upper wall portion 13 are defined by a single monolithic member, the fins 21 are defined by, for example, performing a cutting process on the upper surface of the upper wall portion 13. Note that, in the case where the fins 21 and the upper wall portion 13 are defined by separate members, it is preferable that the fins 21 are made of a metal having a high thermal conductivity, such as, for example, copper or aluminum, as is the above-described cold plate 10. Heat can be efficiently transferred from the cold plate 10 to the fins 21 when the fins 21 are made of a metal having a high thermal conductivity as is the cold plate 10.

In addition, the fins 21 are arranged in parallel and at regular intervals in the longitudinal direction X of the cold plate 10. A mounting region 21a being rectangular in a plan view is arranged in a corner portion of the upper wall portion 13. The pump 30 is arranged in the mounting region 21a. In addition, with the pump 30 being mounted in the mounting region 21a, an upper end of the pump 30 is arranged at a level lower than that of an upper end of each of the fins 21 that are arranged outside of the mounting region 21a.

In the present preferred embodiment, portions of some of the fins 21 are arranged in the mounting region 21a. The portions of some of the fins 21 which are arranged in the mounting region 21a are arranged to have a vertical height smaller than that of the fins 21 which are arranged outside of the mounting region 21a. In the mounting region 21a, the pump 30 is arranged over the cold plate 10 with portions of some (i.e., at least one) of the fins 21 therebetween. Gas passages 21b separated from one another by the portions of some of the fins 21 are defined between a lower surface of the pump 30 and the upper surface of the upper wall portion 13, and cooling air is sent to the gas passages 21b. Thus, an improvement in cooling performance of the radiator 20 is achieved at the mounting region 21a. Note that the shape of the mounting region 21a may be changed in accordance with the shape of the pump 30. Also note that none of the fins 21 may be arranged in the mounting region 21a. In this case, the lower surface of the pump 30 is arranged to be in contact with the upper surface of the upper wall portion 13.

The second coolant passage 22 is defined in the shape of a column inside of a tubular portion 23 in the shape of a rectangular parallelepiped. The tubular portion 23 is a portion of the radiator 20. The tubular portion 23 is arranged above the cold plate 10, and is defined integrally with the upper wall portion 13 of the cold plate 10. Thus, the radiator 20 includes a portion (i.e., the tubular portion 23) defined integrally with the upper wall portion 13, and arranged to define the second coolant passage 22. One end of the second coolant passage 22 is connected to the inflow port 13a, while another end of the second coolant passage 22 is connected to a discharge outlet 31b, which will be described below, of the pump 30. In addition, an upper surface and a side surface of the tubular portion 23 are arranged to be in contact with the fins 21, so that the coolant flowing in the second coolant passage 22 can be efficiently cooled through the fins 21.

The coolant flowing in the second coolant passage 22 is cooled by air flowing between the fins 21 striking the tubular portion 23. In the present preferred embodiment, the second coolant passage 22 is arranged to extend in a horizontal direction at an angle to the direction (i.e., the longitudinal direction X) in which the fins 21 are arranged. Thus, an increased length of the second coolant passage 22 is achieved, making a time for which the coolant flows in the second coolant passage 22 longer. Accordingly, the coolant is cooled inside of the tubular portion 23 for a longer time. This leads to a more efficient cooling of the coolant.

For example, the pump 30 according to the present preferred embodiment is a centrifugal pump, and includes a casing 31 in the shape of a rectangular parallelepiped, and a passage 31d for the coolant defined inside of the casing 31. An impeller (not shown) is arranged in the passage 31d. A lower surface of the casing 31 includes a suction inlet 31a defined therein. The discharge outlet 31b, which is arranged to project outward and which is connected to the passage 31d, is arranged to open at a side surface of the casing 31.

The impeller of the pump 30 is supported to be rotatable about a central axis extending in the vertical direction, and is joined to a rotating shaft of a motor. The impeller is caused to rotate by driving of the motor, so that the coolant, coming in through the suction inlet 31a, is discharged through the discharge outlet 31b.

The suction inlet 31a of the pump 30 and the outflow port 13b, which is open in the upper wall portion 13, are connected to each other in the vertical direction. This leads to a smooth flow of the coolant, and a reduced power consumption of the pump 30. In addition, the pump 30 is arranged over the cold plate 10, and the discharge outlet 31b is joined to the tubular portion 23. The pump 30 is thus arranged adjacent to the radiator 20. Accordingly, a reduction in the size of the cooling apparatus 1 as a whole is achieved with the cold plate 10, the radiator 20, and the pump 30 being combined into a single unit.

Further, the cold plate 10, the radiator 20, and the pump 30 are directly connected to one another, eliminating the need for members, such as, for example, pipes, to join the cold plate 10, the radiator 20, and the pump 30 to one another. This makes it easier to attach the cooling apparatus 1 to a device including the heat-radiating component H.

The pump 30 is arranged in the mounting region 21a. That is, the pump 30 is arranged at the corner portion of the upper wall portion 13. This leads to a greater length of the second coolant passage 22. In addition, in the present preferred embodiment, a blower (not shown) is arranged on a side opposite to the mounting region 21a in the widthwise direction Y as indicated by an arrow D (see FIG. 2), and cooling air is sent from the blower to a side surface of the radiator 20 in the widthwise direction Y.

That is, the pump 30 is arranged on a downstream side of portions of some of the fins 21 in a direction of flow of the cooling air. This arrangement leads to an increase in the total area of surfaces of the fins 21 with which the cooling air makes direct contact. Thus, an improvement in the cooling performance of the radiator 20 is achieved. In addition, when each fin 21 is arranged to extend in the widthwise direction Y, the total area of the surfaces of the fins 21 with which the cooling air makes direct contact is larger than in the case where each fin 21 is arranged to extend in the longitudinal direction X.

Figure 4:
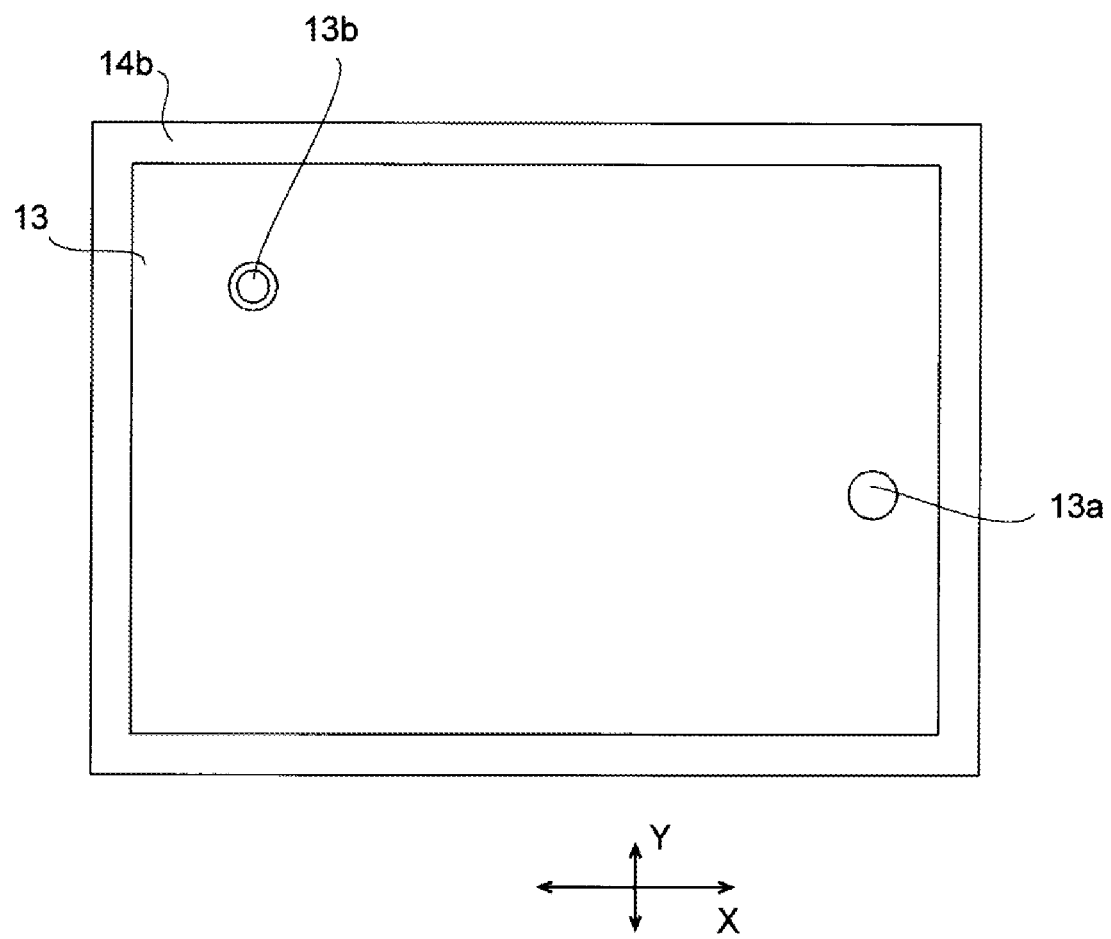
FIG. 4 is a bottom view of an upper wall portion of a cold plate of the cooling apparatus according to the first example embodiment of the present disclosure.
Figure 5:
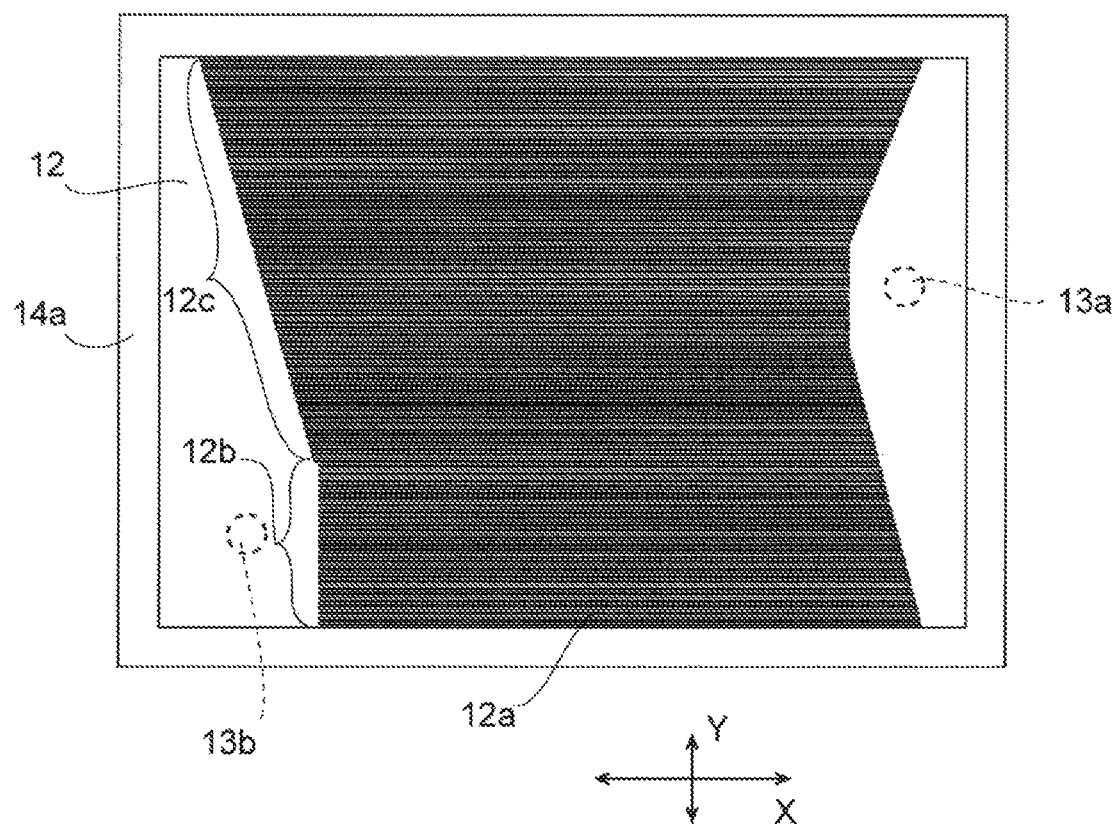
FIG. 5 is a top view of a bottom wall portion of the cold plate of the cooling apparatus according to the first example embodiment of the present disclosure.

FIG. 4 is a bottom view of the upper wall portion 13, and FIG. 5 is a top view of the bottom wall portion 12. In FIG. 5, each of the inflow port 13a and the outflow port 13b, which are defined in the upper wall portion 13, is represented by a broken line. The upper wall portion 13 includes the inflow port 13a and the outflow port 13b, each of which is arranged to pass through a portion of the upper wall portion 13 in the vertical direction. Each of the inflow port 13a and the outflow port 13b is connected to the first coolant passage 11, and is arranged to allow the coolant to flow therethrough. Blades 12a are arranged in the first coolant passage 11. The blades 12a are arranged on the upper surface of the bottom wall portion 12. In addition, the bottom wall portion 12 includes a region in which the blades 12a are not arranged under each of the inflow port 13a and the outflow port 13b. This region is arranged to extend in the widthwise direction Y.

The blades 12a are arranged in parallel and at regular intervals in the widthwise direction Y, and each blade 12a is arranged to extend in the longitudinal direction X of the cold plate 10.

The coolant, flowing into the first coolant passage 11 through the inflow port 13a, spreads in the widthwise direction on the bottom wall portion 12, and flows between the blades 12a. The coolant, flowing between the blades 12a, spreads throughout the first coolant passage 11, and flows out through the outflow port 13b. Thus, an entire lower surface of the cold plate 10 is cooled by the coolant.

In the first coolant passage 11, the coolant flows from the inflow port 13a to the outflow port 13b through the blades 12a. In the bottom wall portion 12, a first region 12b and a second region 12c are arranged in accordance with an arrangement of end portions of the blades 12a on the side closer to the outflow port 13b. In the first region 12b, the end portions of some of the blades 12a are arranged parallel to the direction (i.e., the widthwise direction Y) in which the blades 12a are arranged in parallel. In the second region 12c, the end portions of some of the blades 12a are arranged in a direction at an angle to the direction (i.e., the widthwise direction Y) in which the blades 12a are arranged in parallel.

In the first region 12b, the end portions of some of the blades 12a are preferably arranged to be substantially equidistant from a center of the outflow port 13b. This arrangement enables the coolant to smoothly flow into the outflow port 13b from the first region 12b.

The heat-radiating component H is arranged to be in contact with the lower surface of the bottom wall portion 12 (see FIG. 3). Here, it is preferable that the heat-radiating component H is arranged on a portion of the lower surface of the bottom wall portion 12 which is opposite to the first coolant passage 11 in the vertical direction. When the heat-radiating component H and the first coolant passage 11 are arranged opposite to each other in the vertical direction, heat generated from the heat-radiating component H can be efficiently transferred to the coolant flowing in the first coolant passage 11.

In addition, it is more preferable that the heat-radiating component H is arranged under a region in which the blades 12a are arranged. More specifically, the heat-radiating component H is preferably arranged within the extent of the blades 12a in the longitudinal direction X, in which each blade 12a is arranged to extend, and within the extent of the blades 12a in the widthwise direction Y, in which the blades 12a are arranged. When the heat-radiating component H is arranged under the above region, the heat-radiating component H can be cooled with increased efficiency.

Further, it is more preferable that the heat-radiating component H is arranged to overlap with a line joining the inflow port 13a and the outflow port 13b. The coolant, having been cooled by the radiator 20, flows fastest near the line joining the inflow port 13a and the outflow port 13b. Thus, when the heat-radiating component H is arranged to overlap with this line, the heat-radiating component H can be cooled with increased efficiency.

The pump 30 is driven with the heat-radiating component, such as, for example, a CPU, which is to be cooled, being in contact with the lower surface of the bottom wall portion 12 of the cold plate 10. As a result, the coolant circulates through the first coolant passage 11 and the second coolant passage 22. Heat generated by the heat-radiating component is transferred to the bottom wall portion 12 of the cold plate 10. The heat transferred to the bottom wall portion 12 is transferred to the fins 21 through the upper wall portion 13, and, in addition, is transferred to the fins 21 through the coolant flowing through the first coolant passage 11 and the second coolant passage 22. The heat is thus dissipated through the fins 21, reducing an increase in the temperature of the heat-radiating component.

In addition, the heat dissipation through the fins 21 is promoted by the cooling air being sent from the blower (not shown) arranged on a lateral side of the radiator 20 in the direction (i.e., the widthwise direction Y) in which each fin 21 extends as indicated by the arrow D, so that an additional improvement in the cooling performance of the radiator 20 is achieved.

Figure 6:
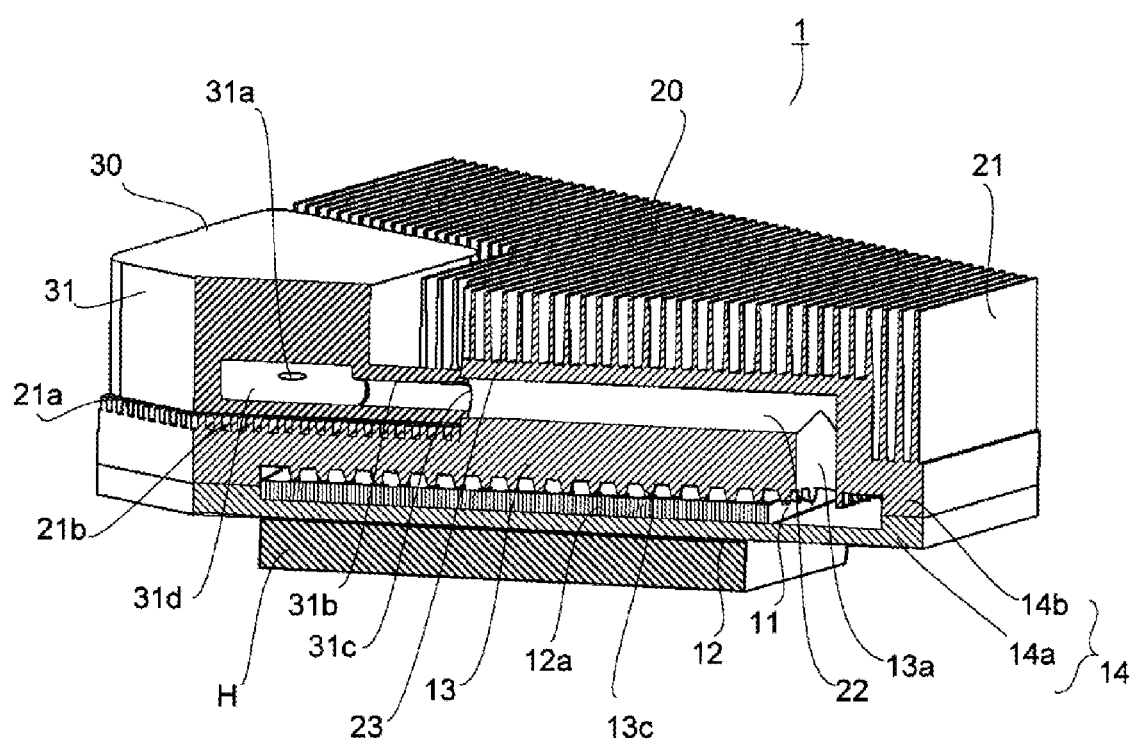
FIG. 6 is a perspective sectional view of a cooling apparatus according to a second example embodiment of the present disclosure.
Figure 7:
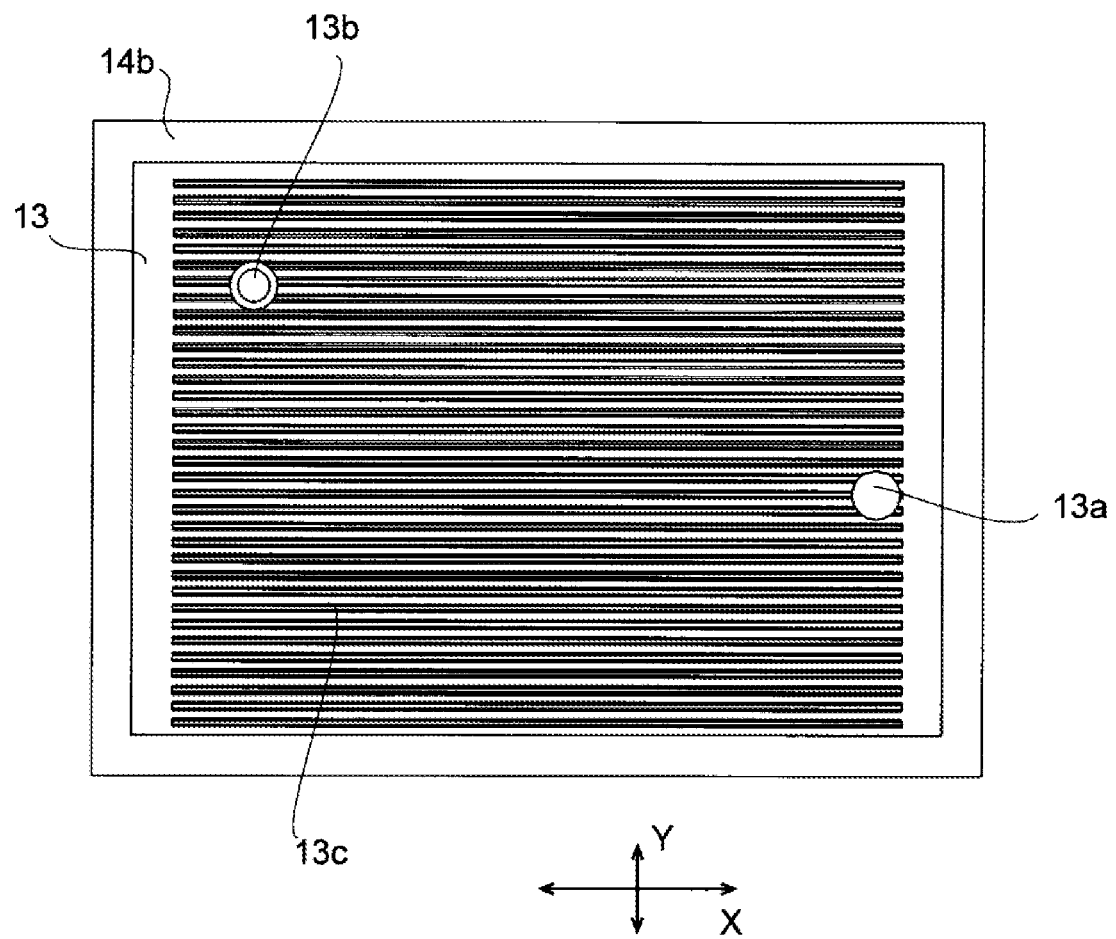
FIG. 7 is a bottom view of an upper wall portion of a cold plate of the cooling apparatus according to the second example embodiment of the present disclosure.

Next, a second preferred embodiment of the present disclosure will now be described below. FIG. 6 is a perspective sectional view of a cooling apparatus 1 according to the second preferred embodiment, and FIG. 7 is a bottom view of an upper wall portion 13 thereof. For the sake of convenience in description, members or portions that have their equivalents in the above-described first preferred embodiment illustrated in FIGS. 1 to 5 are denoted by the same reference numerals as those of their equivalents in the first preferred embodiment. The second preferred embodiment is different from the first preferred embodiment in that a lower surface of the upper wall portion 13 has arranged thereon a plurality of ribs 13c. The second preferred embodiment is otherwise similar to the first preferred embodiment.

Each rib 13c is arranged to project downward from the lower surface of the upper wall portion 13. In addition, in the present preferred embodiment, the ribs 13c are arranged in parallel and at regular intervals in the widthwise direction Y of a cold plate 10, and each rib 13c is arranged to extend in the longitudinal direction X of the cold plate 10. The ribs 13c are arranged at wider intervals than are blades 12a. In addition, a vertical gap is defined between the blades 12a and the ribs 13c.

Each rib 13c is housed in a space of a first coolant passage 11. Thus, an increase in the total area of a surface(s) of the upper wall portion 13 with which a coolant makes contact is achieved. As a result, heat generated by a heat-radiating component and transferred to a bottom wall portion 12 is transferred toward fins 21 with increased efficiency.

Each of an inflow port 13a and an outflow port 13b is arranged to overlap with the ribs 13c. Further, the inflow port 13a and the outflow port 13b are arranged on different sides in the longitudinal direction X, in which each rib 13c extends. When the inflow port 13a and the outflow port 13b are arranged on different sides in the longitudinal direction X, in which each rib 13c extends, an increase in the total area of surfaces of the ribs 13c with which the coolant makes contact is achieved. Thus, heat can be transferred from the coolant to the ribs 13c with increased efficiency. Further, it is preferable that the inflow port 13a and the outflow port 13b are arranged apart from each other in the widthwise direction Y.

Note that the number of ribs 13c may alternatively be one, and that the rib(s) 13c may be arranged in only a portion of the lower surface of the upper wall portion 13.

Figure 8:
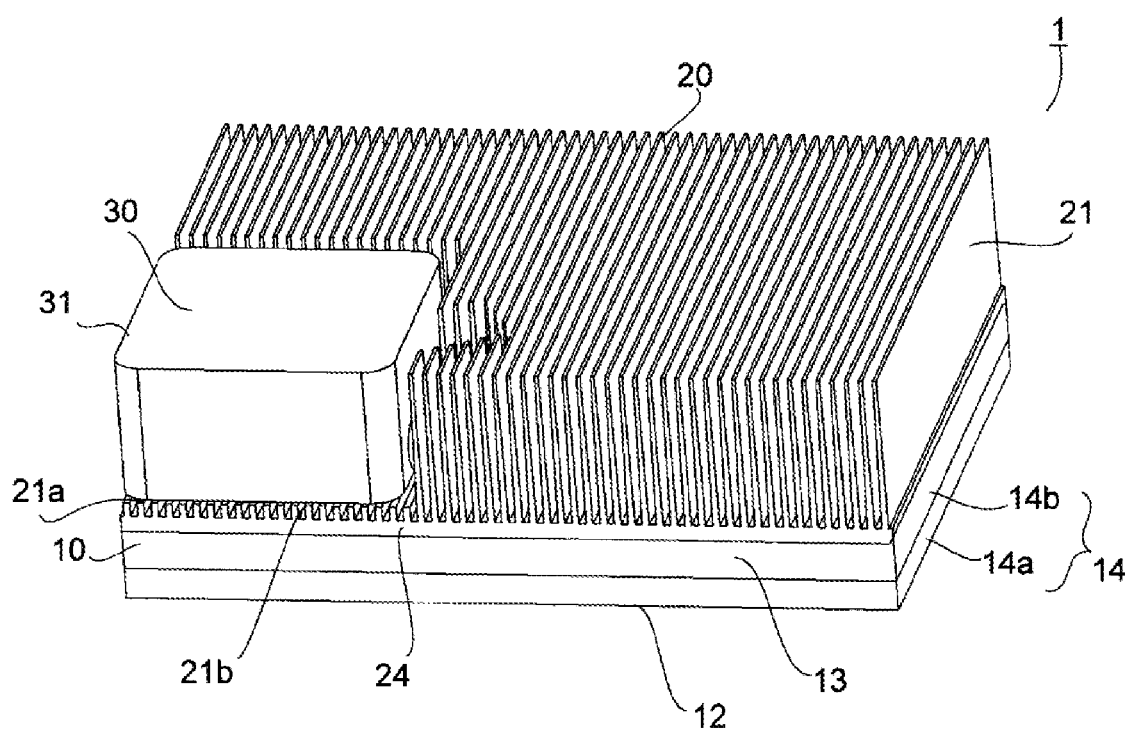
FIG. 8 is a perspective view of a cooling apparatus according to a third example embodiment of the present disclosure.

Next, a third preferred embodiment of the present disclosure will now be described below. FIG. 8 is a perspective view of a cooling apparatus 1 according to the third preferred embodiment. For the sake of convenience in description, members or portions that have their equivalents in the above-described first preferred embodiment illustrated in FIGS. 1 to 5 are denoted by the same reference numerals as those of their equivalents in the first preferred embodiment. The third preferred embodiment is different from the first preferred embodiment in that a radiator 20 includes a plate-shaped base portion 24. The third preferred embodiment is otherwise similar to the first preferred embodiment.

A plurality of fins 21 and a tubular portion 23 are arranged on an upper surface of the base portion 24. A lower end of each fin 21 is arranged to be in contact with the upper surface of the base portion 24. In addition, each of a lower surface of the base portion 24 and an upper surface of an upper wall portion 13 is flat, and the base portion 24 and the upper wall portion 13 are joined to each other. That is, the radiator 20 includes the plate-shaped base portion 24, which has the lower surface arranged to be in contact with the upper surface of the upper wall portion 13, and the lower end of each fin 21 is arranged to be in contact with the upper surface of the base portion 24. Thus, an attachment of the fins 21 can be easily accomplished with the radiator 20 and the cold plate 10 being defined by separate members.

Figure 9:
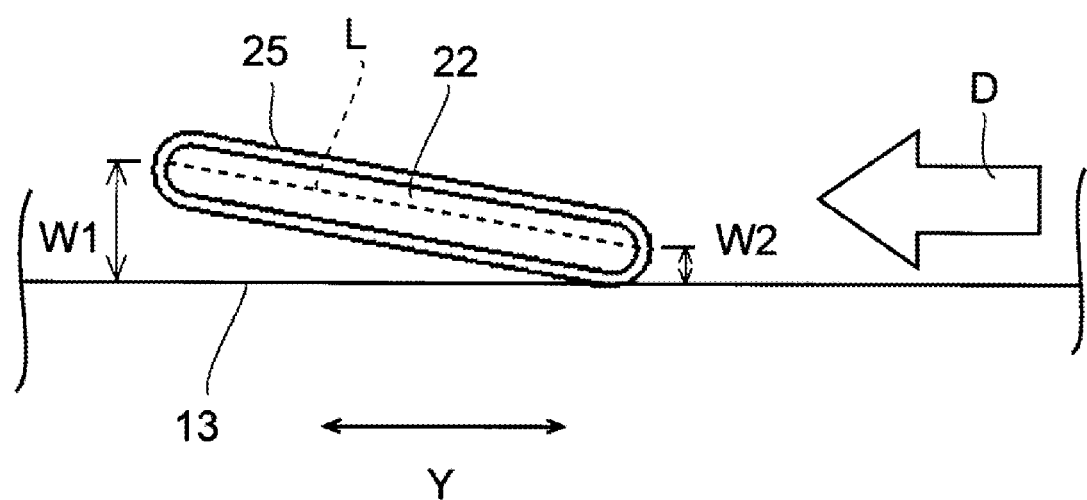
FIG. 9 is a sectional view of a second coolant passage of a cooling apparatus according to a fourth example embodiment of the present disclosure.

Next, a fourth preferred embodiment of the present disclosure will now be described below. FIG. 9 is a sectional view of a second coolant passage 22 of a cooling apparatus 1 according to the fourth preferred embodiment. For the sake of convenience in description, members or portions that have their equivalents in the above-described first preferred embodiment illustrated in FIGS. 1 to 5 are denoted by the same reference numerals as those of their equivalents in the first preferred embodiment. The fourth preferred embodiment is different from the first preferred embodiment in that the second coolant passage 22 is defined by a member different from an upper wall portion 13. The fourth preferred embodiment is otherwise similar to the first preferred embodiment.

The second coolant passage 22 is defined by a hollow pipe 25. The pipe 25 is arranged to have a flat section, and a distance W1 between an upper surface of the upper wall portion 13 and one end of a major axis L of the section of the pipe 25 is different from a distance W2 between the upper surface of the upper wall portion 13 and another end of the major axis L. Cooling air may be sent in a direction indicated by an arrow D from the side on which the distance between the upper surface of the upper wall portion 13 and the major axis L of the pipe 25 is shorter toward the side on which this distance is longer, and this will lead to an increase in the total area of a surface of the pipe 25 with which the cooling air makes direct contact. In addition, a smooth flow of the cooling air along the pipe 25 can thus be achieved. Thus, an additional improvement in cooling performance of a radiator 20 is achieved. Although a lower end of the pipe 25 is arranged to be in contact with the upper surface of the upper wall portion 13 in the present preferred embodiment, the lower end of the pipe 25 may alternatively be arranged opposite to the upper surface of the upper wall portion 13 with a gap therebetween.

It is to be noted that the foregoing description of the preferred embodiments of the present disclosure is meant to be merely illustrative of the present disclosure. Features of the preferred embodiments may be modified appropriately without departing from the scope of the technical idea of the present disclosure. Also note that any possible combination of the preferred embodiments falls within the scope and spirit of the present disclosure.

The pump 30 according to each of the above-described preferred embodiments is a centrifugal pump. Note, however, that other types of pumps, such as, for example, a diaphragm pump or a cascade pump, may alternatively be used. Also note that the cold plate 10 may not be rectangular in a plan view, but may alternatively be circular or in the shape of a quadrilateral such as, for example, a parallelogram in a plan view.

Cooling apparatuses according to preferred embodiments of the present disclosure can be used as, for example, cooling apparatuses to cool an electronic component, such as a microcomputer or the like.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A cooling apparatus comprising:
   a cold plate including a plate-shaped bottom wall portion, an upper wall portion to cover an upper surface of the bottom wall portion, a side wall portion to join outer edges of the bottom wall portion and the upper wall portion, and a first coolant passage in which a coolant flows;
   a radiator including fins to perform cooling, and a second coolant passage in which the coolant flows; and
   a pump connected to each of the first coolant passage and the second coolant passage to circulate the coolant; wherein
   the radiator is provided on the cold plate;
   the pump is located over the cold plate in a first direction and is adjacent to the radiator in a second direction which is perpendicular to the first direction;
   the bottom wall portion includes a lower surface exposed to be contacted from outside of the cooling apparatus;
   the first coolant passage is defined in an interior space enclosed by the bottom wall portion, the upper wall portion, and the side wall portion;
   a plurality of blades which extend in parallel with one another is provided on an upper surface of the bottom wall portion;
   the first cooling passage and overlaps a portion of the second cooling passage when viewed in the first direction;
   the first coolant passage and the second coolant passage are connected to each other;
   the second coolant passage is located above the first coolant passage in the first direction and extends in the second direction; and
   a lower end of each of the fins is in contact with an upper surface of the upper wall portion.

2. The cooling apparatus according to claim 1, wherein the pump is located over the cold plate with a portion of at least one of the fins therebetween.

3. The cooling apparatus according to claim 1, wherein the fins and the cold plate are defined by separate members; and
   a lower end of each of the fins is positioned to be in contact with the upper surface of the upper wall portion.

4. The cooling apparatus according to claim 1, wherein the radiator includes a portion defined integrally with the upper wall portion, and defines the second coolant passage.

5. The cooling apparatus according to claim 1, wherein the radiator includes a plate-shaped base portion including a lower surface positioned to be in contact with the upper surface of the upper wall portion.

6. The cooling apparatus according to claim 1, wherein a lower surface of the upper wall portion includes thereon a rib projecting downward.

7. The cooling apparatus according to claim 1, wherein the pump is located at a corner portion of the upper wall portion.

8. The cooling apparatus according to claim 1, wherein the cold plate is rectangular in a plan view; and
   each of the fins extends in a widthwise direction of the cold plate.

9. The cooling apparatus according to claim 1, wherein the second coolant passage extends at an angle to a direction in which the fins are arrayed.

10. The cooling apparatus according to claim 1, wherein the second coolant passage is defined by a hollow pipe;
    the pipe includes a flat section; and
    a distance between an upper surface of the cold plate and one end of a major axis of the flat section of the pipe is different from a distance between the upper surface of the upper wall portion and another end of the major axis.

11. The cooling apparatus according to claim 1, wherein the cold plate includes an inflow port at or in an area of an end portion of the first coolant passage on one side and through which the coolant flows into the first coolant passage, an outflow port at or in area of an end portion of the first coolant passage on an opposite side and through which the coolant flows out of the first coolant passage;
    in the first coolant passage, the coolant is able to flow from the inflow port to the outflow port through the blades; and
    the cold plate further includes:
      a first region in which end portions of some of the blades on a side closer to the outflow port are parallel to a direction in which the blades are positioned in parallel; and
      a second region in which end portions of some of the blades on the side closer to the outflow port are arrayed in a direction at an angle to the direction in which the blades are positioned in parallel.

12. The cooling apparatus of claim 1, wherein the plurality of blades is located within the first cooling passage and overlaps a portion of the second cooling passage when viewed in the first direction.

* * * * *